United States Patent [19]

Kadomura

[11] Patent Number: 5,540,812
[45] Date of Patent: Jul. 30, 1996

[54] DRY ETCHING METHOD

[75] Inventor: Shingo Kadomura, Kanagawa, Japan

[73] Assignee: Sony Corporation, Tokyo, Japan

[21] Appl. No.: 266,989

[22] Filed: Jun. 28, 1994

Related U.S. Application Data

[62] Division of Ser. No. 18,257, Feb. 16, 1994, Pat. No. 5,360,510, which is a division of Ser. No. 828,743, Jan. 31, 1992, Pat. No. 5,217,570.

[30] Foreign Application Priority Data

Jan. 31, 1991 [JP] Japan ................................. 3-031806
Aug. 15, 1991 [JP] Japan ................................. 3-228580

[51] Int. Cl.$^6$ ................................. H01L 21/90
[52] U.S. Cl. ................................. 156/652.1; 156/646.1; 156/656.1; 437/194; 437/197
[58] Field of Search ................................. 156/665.1, 643.1, 156/646.1, 656.1, 652.1; 437/225, 194, 197; 216/77

[56] References Cited

U.S. PATENT DOCUMENTS

| | | |
|---|---|---|
| 4,208,241 | 6/1980 | Harshbarger et al. |
| 4,670,091 | 6/1987 | Thomas ................................. 156/643 |
| 4,824,521 | 4/1989 | Kulkarni et al. ................................. 156/643 |
| 5,217,570 | 6/1993 | Kadomura ................................. 156/665 |
| 5,277,757 | 1/1994 | Sato ................................. 156/665 |
| 5,310,456 | 5/1994 | Kadomura ................................. 156/657 |
| 5,314,576 | 5/1994 | Kadomura ................................. 156/655 |
| 5,360,510 | 11/1994 | Kadomura ................................. 156/665 |
| 5,378,653 | 1/1995 | Yanagida ................................. 437/194 |

FOREIGN PATENT DOCUMENTS

| | | |
|---|---|---|
| 59-22374 | 5/1984 | Japan. |
| 59-210644 | 11/1984 | Japan. |
| 60-33367 | 2/1985 | Japan. |
| 61-095571 | 5/1986 | Japan. |

OTHER PUBLICATIONS

"Comment on" Low–Temperature Reaction Ion Etching And Microwave Plasma Etching of Silicon; Pelletier; Appl Phys. Lett. (1988); 53 (17); abstract only.

"Reactive Ion Etching Model For Silicon Dioxide"; Fortuno; Mat. Res. Soc. Symp Proc.; (1986); abstract only.

"Prevention of Corrosion During The Reactive Ion Etch of Aluminum on Titanium–Tungsten"; Chang et al.; Proc.–Elect. Soc. (1985); 85–1; abstract only.

Semiconductor World, Apr. 1989, pp. 101–106.

Mizutani et al., "Neutral Beam Assisted Etching", *Digest of Papers, 1990 3rd Microprocess Conference*, Paper 8–5–3, pp. 116–117.

*Extended Abstract of the 38th Spring Meeting (1991) of the Japan Society of Applied Physics and Related Sciences*, pp. 409, Subject 29p–P–6.

*Extended Abstract of the 51st Autumn Meeting (1990) of the Japan Society of Applied Physics*, p. 483, Subject 27p–ZF–5.

*Primary Examiner*—R. Bruce Breneman
*Assistant Examiner*—George Goudreau
*Attorney, Agent, or Firm*—Hill, Steadman & Simpson

[57] ABSTRACT

A dry etching method for etching an aluminum (Al) based layer for effectively combatting the after-corrosion in accordance with three aspects. In the first aspect, while a resist mask and chlorine based gas as known per se are used, $S_2F_2$ is used during etching of the barrier metal layer. In this manner, residual chlorine in a carbonaceous polymer as a sidewall protection material or a resist mask is replaced by fluorine, whilst sulfur yielded from $S_2F_2$ under conditions of discharge dissociation is deposited to provide for sidewall protection effects. In the second aspect, a $SiO_2$ mask and an $S_2Cl_2$ etching gas are used. Since the sidewall protection material is solely sulfur yielded from $S_2Cl_2$, it becomes possible to avoid the effects of the residual chlorine. In the third aspect, an neutral Ar beam is irradiated at a suitable stage in the etching process for increasing the resistance of the $SiO_2$ mask against reducing compounds contained in an etching gas for the layer of the aluminum-based material. By irradiation of the neutral beam, a reduction-resistant layer is produced on the surface of the $SiO_2$ mask to render it possible to reduce the mask thickness without producing problems such as increased step differences on the wafer surface.

5 Claims, 7 Drawing Sheets

DRY ETCHING METHOD

CROSS-REFERENCE TO RELATED APPLICATIONS

This is a division of application Ser. No. 08/018,257, filed Feb. 16, 1993, which issued as U.S. Pat. No. 5,360,510 on Dec. 1, 1994, which issued as U.S. Pat. No. 5,360,510 on Nov. 1, 1994 and was a division of application Ser. No. 07/828,743 filed Jan. 31, 1992, which issued as U.S. Pat. No. 5,217,570 on Jan. 8, 1993.

BACKGROUND OF THE INVENTION

1. Field of the Invention

This invention relates to a dry etching method and more particularly to a dry etching method in which after-corrosion in etching a layer of an aluminum based material may be prevented effectively and in which mask selectivity in case of using an etching mask formed of a silicon oxide ($SiO_x$) based material may be improved.

2. Description of Related Art

As a metallization material for semiconductor devices, aluminum or an aluminum-based material, such as an Al—Si alloy with content of 1 to 2% of Si or an Al—Si—Cu based alloy further containing 0.5 to 1% of Cu, is extensively employed. However, as the junction becomes shallower and the contact hole size becomes finer in keeping up with the recent tendency towards higher integration of the semiconductor devices, there is an increasing risk of malfunction such as destruction or deterioration of the junction or increased contact resistance due to Al elution into a diffusion layer or Si segregation from the metallization material in the contact hole. For this reason, it has become customary to provide a barrier metal layer between the metallization material and a silicon substrate for preventing an alloying reaction therebetween or silicon segregation. This barrier metal layer is usually constituted by transition metals, transition metal compounds such as nitrides, carbides, oxynitrides or borides of transition metals, refractory metal silicides, or alloys thereof. The barrier metal may not only be in the form of a single layer, but may exist as a combination of layers of different kinds of materials.

Meanwhile, in processing the layer of the Al-based material, there is presented a problem of corrosion produced after the end of dry etching, that is after-corrosion, discussed in detail in, for example, pages 101 to 106 of "Semiconductor World", April issue, Published by Press Journal. The following is an outline of the after-corrosion.

Dry etching of the layer of the Al-based material is usually carried out using chlorine based gases, as exemplified by a gas mixture of $BCl_3$ and $Cl_2$, as disclosed in JP Patent Publication KOKAI No.59-22374 (1984). The result is that $AlCl_3$ as a reaction product or decomposition products of the etching gases inevitably remain in the vicinity of the pattern after the end of etching. These products are not only adsorbed to the wafer surface but also occluded within the resist mask. If these chlorine based reaction products or etching gas decomposition products absorb the moisture in the air to form electrolytic liquid droplets, Al is eluted in these droplets to produce corrosion. Besides, while $CCl_x$ polymer formed by the reaction between the resist mask and the chlorine-based active species plays an important role as a sidewall protection film for assuring shape anisotropy, Cl derived from this polymer also becomes harmful residual chlorine after etching.

The problem of after-corrosion is felt more keenly since Cu started to be used as additive in the Al-based interconnection or metallization because CuCl as an etching reaction product is left in the pattern section due to its low vapor pressure and, if water is supplied thereto, a local battery is formed which has Cl– as an electrolyte and Al and Cu as electrodes.

If the above mentioned barrier metal structure, or a structure in which an amorphous silicon layer or the like is stacked as an anti reflection coating on the surface of the Al-based material layer for improving patterning accuracy, is used, the after-corrosion tends to be produced. Since the cross-section of the stacked structure of heterogeneous materials is exposed to the atmosphere as a result of patterning, Al elution is promoted due to local battery effects on formation of the above mentioned droplets. On the other hand, the micro gaps on the interfaces of heterogeneous metals provide sites for chlorine or chlorine compounds to be retained, The after-corrosion is produced to a more or less extent in case of using bromine-based gases as etching gases by the mechanism described above. For this reason, chlorine and bromine are termed herein as halogens. However, fluorine is excluded from the generic term of halogen unless specified to the contrary.

As countermeasures for combatting the after-corrosion, there are known (a) a method of plasma cleaning using fluorocarbon based gases, such as $CF_4$ or $CHF_3$, (b) a method of ashing off the resist pattern by an oxygen plasma, referred to hereinafter as resist ashing, and (c) a method of plasma cleaning by $NH_3$ gas followed by washing with water. These countermeasures are aimed at eliminating residual halogens. That is, the halogen compounds are converted into fluorine compounds for elimination thereof upon vaporization, the resist pattern itself containing a large quantity of the residual halogen is removed for eliminating a halogen source, the halogen compound is converted into inert compounds, such as ammonium halides or, concurrently with the above, $AlF_3$ or $Al_2O_3$ coatings are formed on the surface of the Al-based metallization layer for suppressing the after-corrosion.

However, the above mentioned countermeasures, aimed at eliminating the residuals halogen, are not fully effective to suppress the after-corrosion effectively.

There has also been made a proposal based on a concept different from the above concept of eliminating the residual halogen. According to this proposal, the wafer surface is coated with a carbonaceous polymer, after the end of patterning of the Al-based material layer, using a deposition gas such as $CHF_3$. This technique enables moisture adsorption to be inhibited by the water-repellent carbonaceous polymer to protract the waiting time for the subsequent process step.

Although this method is highly effective, if executed appropriately, it is necessary to carry out resist ashing simultaneously if there is left a larger quantity of halogen. In this case, it becomes difficult to carry out the process due to contradictory requirements that higher temperatures are suited for ashing and lower temperatures are suited for polymer deposition.

As a further approach, it has also been proposed to use a mask of an inorganic material instead of the resist mask as described above. As to the mask of the inorganic material, the JP Patent Publication KOKAI No.60-33367 (1985) discloses a process employing an $SiO_2$ mask. Although it is contemplated herein to achieve a high etching resistance, the process is thought to be essentially excellent as countermeasures against the after-corrosion because the SiO$_2$ mask itself is incapable of occluding halogens, while a sidewall protection material such as CCl$_x$ polymer as a halogen source may not be produced.

However, in order that the process employing the SiO$_2$ mask may be used practically, it is necessary to overcome the latent problem of the increased step level difference on the wafer surface.

It is virtually impossible to eliminate the SiO$_2$ mask after etching of the Al-based layer because the underlying Al-based layer is usually an insulating film composed of SiO$_2$-based material and, if the SiO$_2$ mask is removed, the insulating film is removed simultaneously. Thus the SiO$_2$ mask is left and used as a portion of the interlayer insulating film covering the patterned Al-based layer. However, this tends to increase the step level differences on the wafer surface to render it difficult to achieve desired planarization by the interlayer insulating film.

Although this inconvenience may be obviated to some extent by diminishing the thickness of the SiO$_2$ mask, it is difficult to diminish the SiO$_2$ mask thickness under the current state of the art. A reducing gas, such as BCl$_3$, is usually added to the etching gas for the Al-based layer for removing a native oxide film on a surface thereof. Since the SiO$_2$ mask is partially reduced to Si by this reducing gas, the SiO$_2$ mask is attacked by Cl$^*$ and thereby partially removed. The SiO$_2$ mask needs to be thick enough to take account of the partial removal.

OBJECTS AND SUMMARY OF THE INVENTION

It is an object of the present invention to provide a dry etching method for etching an Al-based layer whereby the effects of the residual halogens may be overcome more effectively than in the conventional process.

It is another object of the present invention to provide a dry etching method whereby, when an SiO$_2$ mask is used for overcoming the effects of residual halogens, mask selectivity may be improved even under a reducing atmosphere to thereby enable the mask thickness to be reduced.

For accomplishing the above objects, the present inventor has set up the following three guidelines.

The first guideline is that, while known chlorine compounds or bromine compounds are used to etch the Al-based layer using the resist material as an etching mask, as conventionally, the gas composition is switched when etching the barrier metal for removing the resist decomposition products for forming another sidewall protection film for protecting the pattern sidewall.

The second guideline is that, when employing an SiO$_2$ mask, a deposition material which does not become a supply source of residual halogens is generated in a gaseous phase for assuring high shape anisotropy.

The third guideline is that the SiO$_2$ mask is rendered reduction-resistant for enabling the mask to be reduced in thickness.

According to the present invention, a compound composed of S (sulfur) and F (fluorine) as constituent elements is used during etching of the barrier metal in accordance with the first guideline.

Since the resist mask is used herein, a sidewall protection film, composed of CCl$_x$ polymer or CBr$_x$ polymer, is generated, as conventionally, during etching of the Al-based layer. Then it becomes necessary to carry out the next step of removing the sidewall protection film or substituting another element not producing corrosion for the residual halogen and simultaneously forming a substitutive sidewall protection film. It is a compound containing S and F as constituent elements which have attracted the present inventor's attention. If the etching of the barrier metal is performed using an etching gas composed mainly of the above compound, CCl$_x$ or CBr$_x$ may be decomposed and removed, at least partially, depending on the operating conditions. Even granting that small amounts of the resist decomposition products or aluminum halides are left, Cl or Br therein are replaced by F. This is also supported by the fact that the relative magnitudes of the interatomic bond energy between the atoms concerned are expressed by inequalities C—F>C—X and Al—F>Al—X, where X denoted Cl or Br. Simultaneously, sulfur is deposited on the pattern sidewall, above all, on the sidewall of the barrier metal, so as to play the role of sidewall protection during etching and passivation after etching.

Meanwhile, the present Assignee previously proposed a technology apparently similar to the above mentioned aspect of the present invention and which resides in etching a layer of an Al-based material, using an etching gas mainly composed of a compound containing S and Cl as component elements and an etching mask formed by a three-layer resist process. According to the three-layer resist process, an intermediate layer composed of an SOG (spin-on-glass) etc. and a lower resist layer patterned with the use of an intermediate layer as a mask. Thus, resist decomposition products also are not supplied into the system in this case. This prior-art technology, however, is mainly aimed at utilizing sulfur deposition for achieving high anisotropy even in cases wherein the resist decomposition products can not be utilized for sidewall protection, while it leaves much to be desired with respect to combatting the after-corrosion. It is because the risk is high with the above described prior-art technology that resist residues remain on a wafer during patterning of the lower resist layer and, if residual chlorine produced during etching of the Al-based layer is taken up by these residues, the after-corrosion is produced inevitably.

On the contrary, since no organic material is employed in the etching mask in accordance with the present invention, the above mentioned problem is not produced, so that the present invention differs from the above described prior-art technology in both the operation and effects.

In the present invention in accordance with the second guideline, described above, since the decomposition products of the etching mask can not be utilized for sidewall protection, the sidewall protection film is produced from products derived from a gas system. Specifically, the present inventor drew attention to compounds containing S and Cl or S and Br as component elements and arrived at a concept of performing a low temperature etching using an etching gas mainly composed of these compounds for depositing sulfur on the pattern sidewall. In distinction from the conventional sidewall protection film composed of CCl$_x$ or CBr$_x$, the sulfur deposits formed in this manner do not become a supply source of Cl or Br. Besides, the sulfur deposit may be sublimed off easily on heating so that, even though minor amounts of residual halogens have been taken up in inner pores or the like, these are not retained ultimately. Therefore, the sulfur deposit may be utilized not only as a sidewall protection film for achieving anisotropy, but also becomes a passivation film for protecting the pattern sidewall from the atmosphere from the end of etching until the initiation of the subsequent process step.

In the present invention in accordance with the third guideline, neutral beam irradiation is employed.

For example, in Extended Abstract of the 38th Spring Meeting (1991) of the Japan Society of Applied Physics and Related Sciences, page 409, lecture number 29p-P-6, a report has been made of the results of experiments concerning the irradiation of a neutral beam on an $SiO_2$ layer formed by a thermal oxidation method. It is seen from this report that the analyses, which were conducted of the surface $SiO_2$ composition by a Rutherford back scattering spectroscopy (RBS) after irradiation indicated that the $SiO_2$composition was maintained. It is also seen from the report that the analyses of a depth profile by an Auger electron spectroscopy (AES) indicated that, with an unirradiated sample, $SiO_2$ was reduced with the progress of the ion etching and a Si absorption peak was observed, whereas, with a sample irradiated by a neutral beam, no Si absorption peak was observed. This means that at least the surface layer of the $SiO_2$ has been rendered reduction-resistant as a result of irradiation with the neutral beam.

Although the mechanism of the formation of the reduction-resistant layer is not clear at present, the results of the experiment shown by the above report indicate that irradiation with the neutral beam is highly effective in improving reduction resistance of the $SiO_2$ mask in the course of etching of the Al-based layer. That is, if a wafer is irradiated with the neutral beam before or during etching of the Al-based layer to modify the surface of the $SiO_2$ mask to render it reduction-resistant, there is no risk of lowering of mask selectivity although reducing gases are added to the etching gas. Thus it becomes possible to diminish the thickness of the $SiO_2$ mask.

While the above is the basic concept of neutral beam irradiation, three different methods of approach may be thought of in selecting the timing of etching of the Al-based layer and neutral beam irradiation.

The first approach is to carry out neutral beam irradiation before etching of the Al-based layer.

The second approach is to perform the neutral beam irradiation and partial etching of the Al-based layer along its thickness in an alternate manner. Although a reduction-resistant layer produced by the neutral beam irradiation on the surface of the $SiO_2$ is remarkably improved in etching resistance as compared with an unirradiated $SiO_2$ mask, removal of a certain quantity of the material by ion sputtering and some reduction by the reducing gases occur inevitably if the mask is exposed to high density plasma. For this reason, the etching process for the Al-based layer is divided into plural stages and neutral beam irradiation is again performed after the reduction-resistant layer is diminished or has disappeared for re-forming a reduction-resistant layer. Although the number of process steps is increased, a thinner $SiO_2$ mask may be available than is possible with the first approach.

The third approach is to effect neutral beam irradiation and etching of the Al-based layer simultaneously. In this case, a reduction-resistant layer is present at all times on the $SiO_2$mask surface and the Al-based layer is etched by a so-called neutral beam assisted etching mechanism.

The neutral beam assisted etching is a technique publicized in, for example, Extended Abstract of the 51st Autumn Meeting (1990) of the Japan Society of Applied Physics, p.483, lecture number 27p-ZF-5 or Digest of Papers, 1990 3rd. MicroProcess Conference, B-5-3, and resides in performing anisotropic etching while a kinetic energy of a neutral beam is supplied to an etchant adsorbed on the surface of an etched material. This process has been developed with an eye drawn to the fact that the mechanism of the ion assisted reaction in plasma etching depends mainly on the kinetic energy of the ions while the electrical charges of the ions are intrinsically not necessary. The technique is highly effective in avoiding radiation damage by charged particles. The third approach thus results in a process with ultra-high selectivity and ultra-low damage.

It will be seen from the above that the present invention provides effective and practically useful measures for combatting the after-corrosion to render it possible to improve the yield and reliability of semiconductor devices significantly.

BRIEF DESCRIPTION OF THE DRAWINGS

FIGS.1a to 1d are schematic cross-sectional views showing a typical process according to the present invention, step by step, wherein FIG. 1a shows the state in which a photoresist pattern as an etching mask has been formed on a multilayer film, including an Al—1% Si layer, FIG. 1b shows the state in which etching of the multilayer film has been completed as far as the Al—1% Si layer, FIG. 1c shows the state in which a TiW layer has been patterned and FIG. 1d shows the state in which the photoresist pattern and a sidewall protection film are both removed.

FIGS. 2a to 2c are schematic cross-sectional views showing another typical process according to the present invention, step by step, wherein FIG. 2a shows the state in which an SOG pattern as an etching mask has been formed on a multi layer including an Al—1% Si layer, FIG. 2b shows the state in which a metallization pattern has been formed by etching and FIG. 2c shows the state in which the SOG pattern and the sidewall protection film have been removed.

FIGS. 4a to 4c are schematic cross-sectional view showing a further typical process according to the present invention, step by step, wherein FIG. 4a shows the state in which an $SiO_2$ mask has selectively been formed on an Al—1% Si—0.5% Cu layer stacked on a barrier metal layer, FIG. 4b shows the state in which a reduction-resistant layer has been formed on the $SiO_2$ mask by irradiation of a neutral Ar beam, and FIG.4c shows the state in which the Al—1% Si—0.5% Cu layer and the barrier metal layer have been etched anisotropically.

FIG. 5a shows the state in which a reduction-resistant layer has been formed on a surface of an $SiO_2$ mask by neutral beam irradiation, FIG. 5b shows the state in which the Al—1% Si—0.5% Cu layer has been etched halfway, FIG. 5c shows the state in which a reduction-resistant layer has again been formed on the surface of the $SiO_2$ mask by neutral Ar beam irradiation, and FIG. 5d shows the state in which the remaining portion of the Al—1% Si—1% Cu layer as well as the barrier metal layer has been etched anisotropically.

FIGS. 7a and 7b are schematic cross-sectional view showing a yet further typical process according to the present invention, step by step, wherein FIG. 7a shows the state in which an Al—1% Si0.5% Cu layer has been etched halfway by neutral beam assisted etching, and FIG. 7b shows the state in which the etching has been terminated.

DETAILED DESCRIPTION OF THE INVENTION

The present invention will be explained with reference to certain non-limitative Examples.

EXAMPLE 1

In the present Example 1, etching as far as an Al—1% Si layer was made using a usual resist mask and a chlorine-based gas and etching as far as barrier metal layer was made using an $S_2F_2$ gas. The process will be explained by referring to FIGS. 1a to 1d.

Figure 1A:
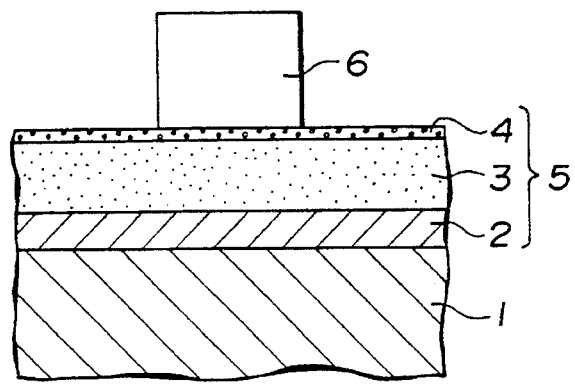

A wafer was first prepared, in which, as shown in FIG. 1a, a TiW layer 2 about 200 nm thick, an Al—1% Si layer 3, about 400 nm thick and an amorphous silicon layer 4 about 30 nm thick, were stacked sequentially to form a multilayer film 5, and a photoresist pattern 6 was formed as an etching mask. Meanwhile, the TiW layer 2 was used as a barrier metal layer, and the amorphous silicon layer 4 was used as an antireflection film for improving accuracy in photolithography used for forming the photoresist pattern.

Figure 1B:
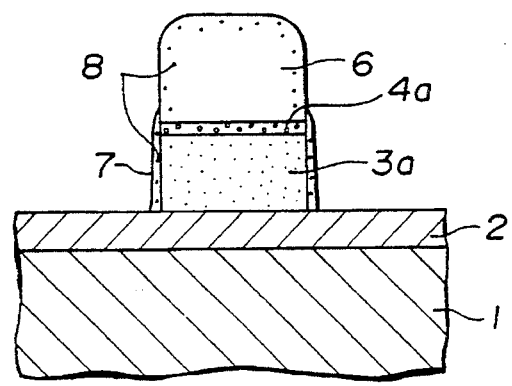

The amorphous silicon layer 4 and the Al—1% Si layer 3 were then etched with the photoresist pattern 6 as a mask. That is, the above wafer was set on a magnetic microwave plasma etching apparatus and etching was performed under the conditions of a $BCl_3$ flow rate of 20 SCCM, a $Cl_2$ flow rate of 30 SCCM, a gas pressure of 1.3 Pa (10 mTorr), a microwave power of 1000 W and an RF bias power of 100 W (13.56 MHz). In the course of the etching process, a carbonaceous polymer $CCl_x$, produced from the photoresist pattern 6 sputtered by $BCl_x^+$ or $Cl_x^+$ ions, was deposited on the pattern sidewall to form a $CCl_x$ based sidewall protection film 7. In this manner, the amorphous silicon pattern 4a and the Al—1% Si pattern 3a were formed with good shape anisotropy, as shown in FIG. 1b. It is noted that residual chlorine 8 was adsorbed on or occluded in the photoresist pattern 6 and the $CCl_x$ based sidewall protection film 7, as shown schematically in FIG. 1. Meanwhile the residual chlorine herein means reaction products, such as $AlCl_3$, decomposition products of the etching gas or Cl atoms constituting the $CCl_x$ based sidewall protection film 7, exhaustively.

Figure 1C:
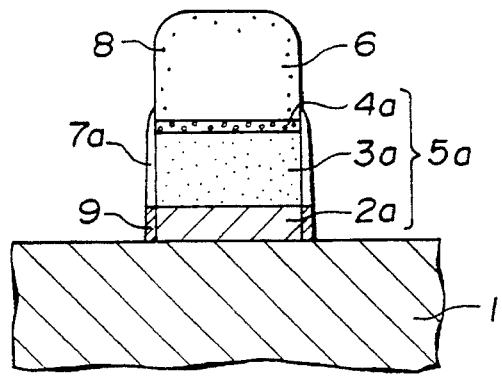
Figure 1D:
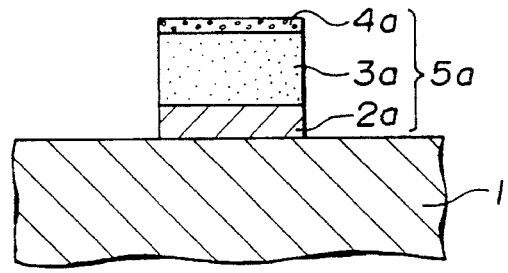

A cooling medium, such as ethanol, was then circulated through a cooling conduit housed in a wafer setting electrode, and the barrier metal layer, that is the TiW layer 2, was etched, under the conditions of an $S_2F_2$ flow rate of 50 SCCM, a gas pressure of 1.3 Pa (10 retort), a microwave power of 850 W, an RF bias power of 100 W (13.56 MHz) and a wafer temperature of −50° C. While the TiW layer 2 was etched in the course of this process by the action of $SF_x^+$, $S^+$ or $F^*$, decomposition products of the photoresist pattern 6 were scarcely supplied. Instead, sulfur yielded in the plasma by discharge dissociation of $S_2F_2$ was deposited on the pattern sidewall to form a sulfur-based sidewall protection film 9. As a result, a TiW pattern 2a having a good anisotropic shape was formed and a metallization pattern 5a exhibiting shape anisotropy as a whole was formed, as shown in FIG. 1c. Also, part of the $CCl_x$ was decomposed and removed, while the remaining part thereof underwent Cl—F exchange so as to be converted into a $CF_x$ based sidewall protection film 7a. In this manner, the residual chlorine 8 on the sidewall section of the metallization pattern 5a was removed completely.

Meanwhile, FIG. 1c shows a typical state of formation of the sidewall protection film and, as the case may be, the $CCl_x$ based sidewall protection film 7 is removed substantially completely, whereas the pattern sidewall was substantially covered only with a sulfur-based sidewall protection film 9. Besides, there may be occasions wherein the surface of the $CF_x$ based sidewall protection film 7a is additionally covered by the sulfur-based sidewall protection film 9.

The wafer was then transferred to a plasma ashing device and, whilst the wafer was heated to about 150°C., resist ashing was performed under the conditions of $O_2$ flow rate of 50 SCCM, a $CH_3OH$ flow rate of 30 SCCM, a gas pressure of 133 Pa (1 Torr) and a microwave power of 850 W. As a result, the photoresist pattern 6 and the $CF_x$ based sidewall protection film 7a were decomposed and removed and, concomitantly, the residual chlorine 8, occluded in the photoresist pattern 6, was also removed. By the heating which occurred at this time, the sulfur-based sidewall protection film 9 was also removed promptly. In addition, the residual chlorine adsorbed on the wafer surface was replaced by $F^*$ yielded from the fluorine-based gas, On the wafer processed in the above described manner, the time which elapsed since the wafer was taken out into open air until the occurrence of the after-corrosion was prolonged to three or more times of that with the conventional wafer.

Although the chlorine-based gas was used in the present Example for etching the amorphous silicon 4 and the Al—1% Si layer 3, a Br-based gas mixture, such as $BBr_3$—$Br_2$ gas, may also be employed. Since it suffices in this case if Cl (chlorine) in the above described process reads Br (bromine), detailed description is omitted for simplicity.

In the present Example, $S_2F_2$ was used as a compound containing S and F as constituent elements. This compound is among the compounds known as sulfur fluorides, which also include $SF_2$, $SF_4$ and $S_2F_{10}$ as stable compounds. Besides, $SF_6$ is also among the sulfur fluorides and put to practical use as a gas for dry etching. However, this compound is not convenient for the purpose of the present invention because it has a high F/S ratio (ratio of the number of fluorine atoms to that of sulfur atoms in one molecule) and hence generates a large quantity of $F^*$ and, besides, it has been confirmed that the compound hardly yields sulfur on discharge dissociation.

EXAMPLE 2

In the present Example, a multilayer film including an Al-based layer was etched using an $S_2Cl_2$ gas and an etching mask composed of spin-on-glass (SOG). This process will be explained by referring to FIGS. 2a to 2c.

Figure 2A:
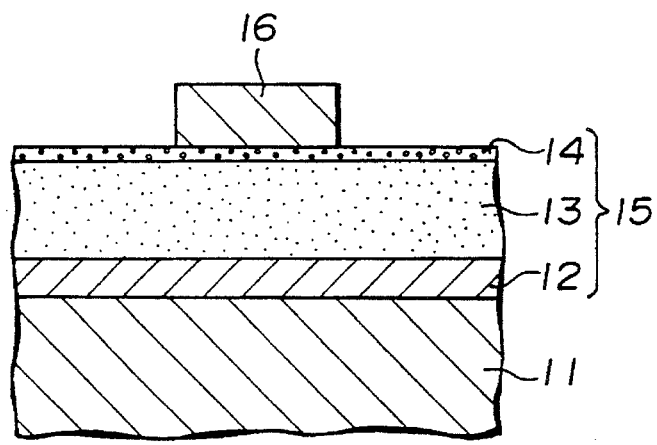

A wafer was first prepared, in which, as shown in FIG.2a, a TiW layer 12 about 200 nm thick, an Al—1% Si layer 13, about 400 nm thick and an amorphous silicon layer 14 about 30 nm thick, were stacked sequentially to form a multilayer film 15, and an SOG pattern 16 was formed as an etching mask. Meanwhile, the TiW layer 12 was used as a barrier metal layer. The SOG pattern 16 was patterned using a photoresist mask, not shown, while the amorphous silicon layer 14 was provided as an anti reflection film for improving accuracy in photolithography when forming the photoresist mask.

Figure 2B:
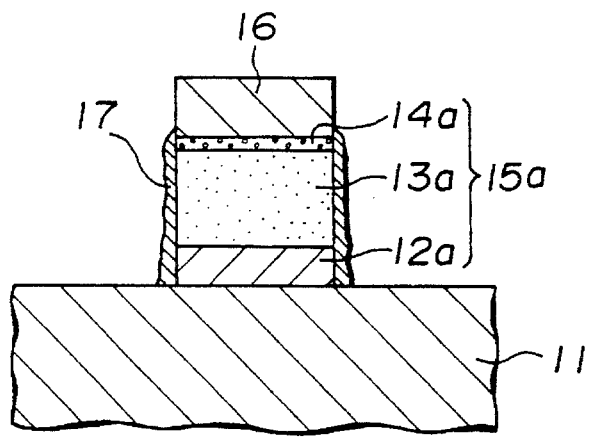
Figure 2C:
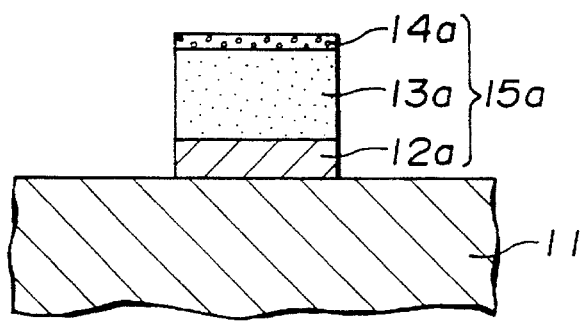

The multilayer film 15 was then patterned, using the SOG pattern as the mask 16. Thus the wafer was set on, for example, a wafer setting electrode of a magnetic microwave plasma etching system. It is noted that the wafer setting electrode is designed for circulating a suitable cooling medium through a cooling conduit housed therein for maintaining the wafer temperature at a temperature at or below 0° C. during the etching. The etching was carried out under the conditions of an $S_2F_2$ flow rate of 50 SCCM, a gas pressure of 1.3 (10 mTorr), a microwave power of 850 W, an RF bias power of 100 W (13.56 MHz) and a wafer temperature of −30°C. In the course of this etching process, etching of the multilayer film 15 proceeded by the action of chlorine-based active species yielded by discharge decomposition of $S_2Cl_2$. However, since this etching naturally proceeded with a high selectivity of an underlying insulating film 11, selectivity was similarly high as far as the SOG pattern 16, formed of a silicon oxide based material as is the interlayer insulating film 11, is concerned. Thus the SOG pattern 16 was scarcely sputtered under the above mentioned conditions, and a decomposition product, with a low vapor pressure capable of being deposited on the pattern sidewall, was not produced. Instead, the sulfur produced in the plasma due to discharge decomposition of $S_2Cl_2$ was deposited on the pattern sidewall since the wafer was already cooled, so that sulfur-based sidewall protection film 17 was formed competitively with the etching reaction. As a result thereof, as shown in FIG. 2b, patterns of respective layers, shown by the same reference numerals but with suffixes a thereto, were formed at the same time that an Al—1% Si pattern 13a was formed, so that a metallization pattern 15a which has generally a good shape anisotropy, was formed.

It is noted that the sulfur-based sidewall protection film 17 is itself free from Cl as a constituent element, in a manner different from the conventional sidewall protection film composed of, for example, $CCl_x$. For this reason, the film 17 does not become a supply source for residual chlorine, even when deposited on the metallization pattern 15a. Rather, the protection film 17 plays the role of passivating the sidewall for preventing Cl* from being adsorbed by isolating the sidewall from the etching atmosphere.

The wafer was then transferred to a plasma etching device and, whilst the wafer was heated to about 150°C., the SOG pattern 16 was removed under the conditions of $C_3F_8$ flow rate of 50 SCCM, a gas pressure of 5 Pa and a microwave power of 850 W. By the heating which occurred at this time, the sulfur-based sidewall protection film 17 was also promptly sublimed off. In addition, the residual chlorine adsorbed on the wafer surface was replaced by F* yielded from the fluorine-based gas.

On the wafer processed in the above described manner, the time which elapsed since the wafer was taken out until the occurrence of the after-corrosion was prolonged to three or more times of that with the conventional wafer.

In the present Example, $S_2Cl_2$ was used as a compound containing S and Cl as constituent elements. This compound is among the compounds known as sulfur chlorides, which also include $S_3Cl_2$, $SCl_2$ etc. as stable compounds.

The compounds from which similar effects may be expected include $S_2Br_2$, $S_3Br_2$ and $SBr_2$ containing S and Br as constituent elements.

Although SOG which could be formed at a lower temperature was used in the above Example as a constituent material for a silicon oxide based etching mask, a silicon oxide based thin film which may be formed by e.g. bias sputtering may also be employed.

EXAMPLE 3

In the present Example, a reduction-resistant layer was formed on the surface of an $SiO_2$ mask, using a neutral Ar beam, and an Al—1% Si—0.5% Cu layer and a barrier metal layer were subsequently etched using a $BCl_3/Cl_2/HBr$ mixed gas.

Figure 3:
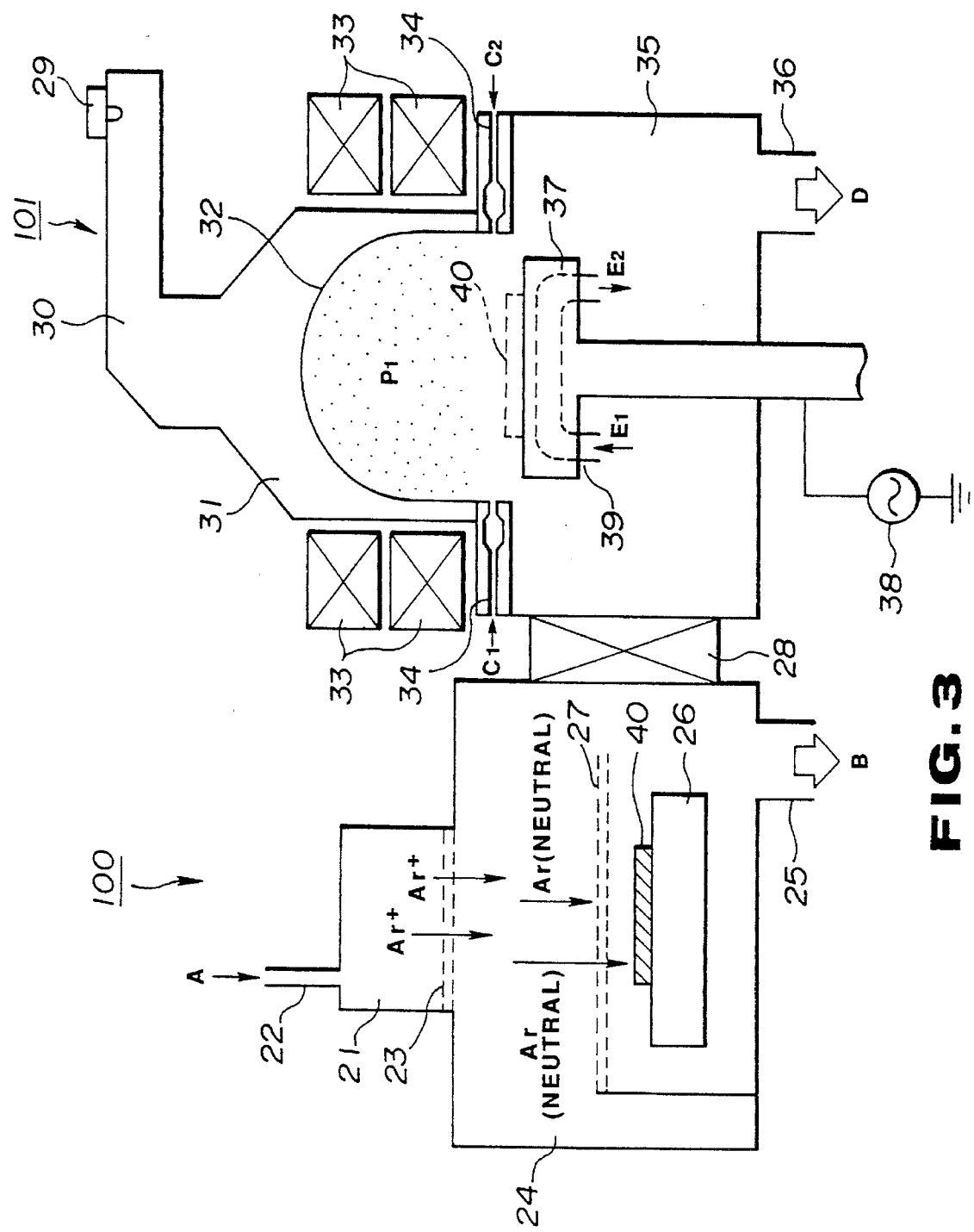
FIG. 3 is a schematic cross-sectional view showing a constructional example of an etching apparatus employed in practicing the present invention.

An etching apparatus employed in the present Example is shown schematically in FIG. 3. This system is made up of a neutral beam irradiating unit 100 and an RF bias impressing type magnetic microwave etching unit 101, interconnected by means of a gate valve 28.

The neutral beam irradiating unit 100 is mainly composed of an ionizing chamber 21 for ionizing a feed gas supplied from the direction shown by arrow A in FIG. 3 by means of a gas supply duct 22, a neutral beam irradiation chamber 24 connected to the ionizing chamber 21 by means of a multiaperture electrode 23 and housing a wafer stage 26 on which to set a wafer 40, and a charged particle removal electrode 27 disposed above the wafer 40 in the neutral beam irradiation chamber 24 for removal of charged particles. The inside of the neutral beam irradiation chamber 24 is connected to a vacuum source, not shown, by means of an air vent duct 25, and is evacuated to high vacuum in a direction shown by arrow B in FIG. 3.

With the present apparatus, ions produced in the ionizing chamber 21 are introduced by means of the multiaperture electrode 23 into the neutral beam irradiation chamber 24 where they are neutralized by a charge exchange reaction with the background gas and thereby converted into a neutral beam which is then irradiated on the wafer 40 after removal of unneutralized residual ions by the charged particle removal electrode 27.

On the other hand, the magnetic plasma etching unit 101 is mainly composed of a magnetron 29 for generating the microwave of 2.45 GHz, a rectangular waveguide 30 and a circular waveguide 31 for guiding the microwave generated from the magnetron 29, a quartz bell jar 32 for taking in the microwave and adapted for generating a plasma $P_1$ in the inside thereof by electron cyclotron resonance (ECR), an etching gas supply duct 34 for supplying an etching gas from the directions shown by arrows $C_1$, $C_2$, a solenoid coil 33 mounted for encircling the bell jar 32 and adapted for producing a magnetic flux with a magnetic flux density of $8.75 \times 10^{-2}$ T (=875 Gauss), satisfying the ECR conditions, in a suitable region in the bell jar 32, and a sample chamber 35 connected to the bell jar 32 and housing a wafer setting electrode 37. The sample chamber 35 may also be advantageously employed in transporting the wafer 40. The unit 101 also includes an RF power source 38 for applying an RF bias to the wafer setting electrode 37. The sample chamber 35 is connected by means of vent duct 36 to the vacuum source, not shown, and is evacuated to high vacuum in the direction shown by arrow D in FIG.3. A cooling duct 39 is housed within the wafer setting electrode 37 and a suitable cooling medium from a cooling device, such as a chiller, not shown, is circulated in a direction shown by arrows $E_1$, $E_2$ for cooling the wafer 40.

A typical process which will be executed by the above apparatus will be explained by referring to FIGS. 4a to 4c.

Figure 4A:
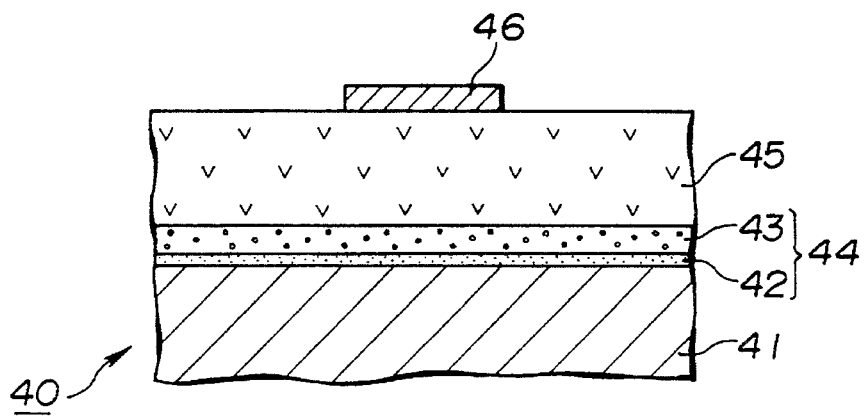
Figure 4B:
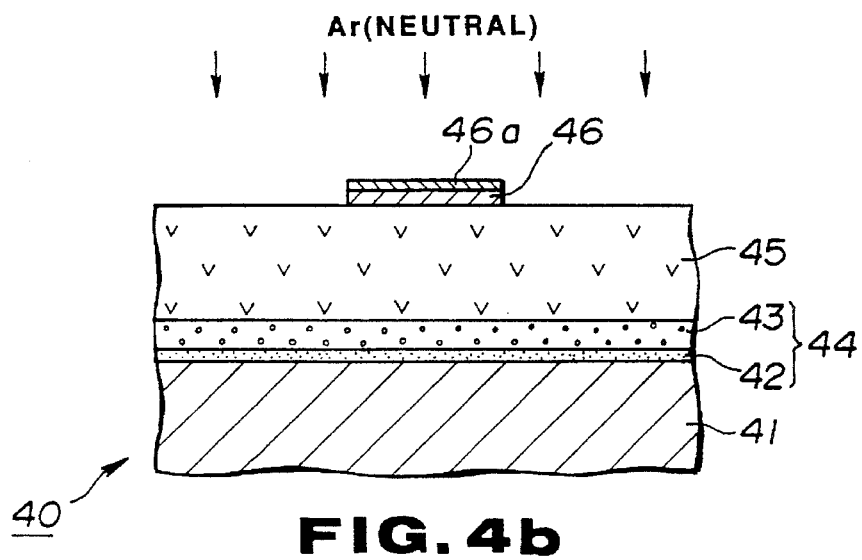

First, as shown in FIG. 4a, a barrier metal layer 44, comprised of a Ti layer 42 about 30 nm thick and a TiON layer about 70 nm, and an Al—1%—0.5% Cu layer 45 about 400 nm thick, were formed by sputtering in this order on an $SiO_2$ interlayer insulating film 41, and an $SiO_2$ mask 46 about 50 nm thick, patterned to a predetermined contour, was formed on the layer 45. It is noted that, for forming the $SiO_2$ mask 46, an $SiO_2$ deposition layer was formed on the entire wafer surface by CVD under a normal pressure by using, for example, a $O_3$-TEOS (tetraethoxysilane) gas, a resist mask was then formed using a novolac based positive photoresist manufactured by TOKYO OKA KOGYO KK under the trade name of TSMR-V3 and an g-line stepper, and the $SiO_2$ deposition layer was selectively etched within a magnetron reactive ion etching (RIE) device using a $C_3F_8$ gas.

The wafer 40 was set on the wafer stage 26 of the neutral beam irradiation unit 100. An Ar gas was introduced by the gas supply duct 22 into the ionizing chamber 21 for generating $Ar^+$ ions therein. These $Ar^+$ ions were taken by means of the multiaperture electrode 23 as an ion beam which was converted by a charge exchange reaction into a neutral Ar beam which was caused to be incident on the wafer 40 by means of the charged particle removal electrode 27. As a result of the irradiation, a reduction-resistant layer 46a was formed on the surface of the $SiO_2$ mask 46, as shown in FIG. 4b.

The wafer 40 was then transported into the sample chamber 35 of the magnetic microwave plasma etching unit 101 by means of the gate valve 28 and set on the wafer setting electrode 37. Ethanol was circulated as a cooling medium through the cooling conduit 39 for maintaining the wafer at a temperature of approximately –30° C. during etching. The Al—1% Si—0.5% Cu layer 45 and the barrier metal layer 44 were etched under the conditions of a $BCl_3$ flow rate of 20 SCCM a $Cl_2$ flow rate of 30 SCCM, an HBr flow rate of 40 SCCM, a gas pressure of 1.3 (10 mTorr), a microwave power of 1000 W and an RF bias power of 30 W (2 MHZ).

In the course of this etching process, etching proceeded anisotropically by a mechanism in which the radical reaction by $Cl^*$ and $Br^*$ radicals were assisted by $B^+$, $BCl^+$, $Cl^+$ and $Br^+$ ions. In this manner, the constituent elements of the Al—1% Si—0.5% Cu layer 45 and the barrier metal layer 44 were removed in the form of chlorides or bromides. In FIG. 4c, only $AlCl_x$, $AlBr_x$ and $TiCl_x$ are entered as typical examples of these products. As a result thereof, an Al—Si—Cu metallization layer 45a and a barrier metal layer 44a presenting shape anisotropy were formed. In the drawing, the patterns formed by etching are indicated by reference numerals of the corresponding unetched layers with surf letters a appended thereto.

Meanwhile, the above etching gas was added to by $BCl_3$ as a reducing gas for removing a native oxide film existing on the surface of the Al—1% Si—0.5% Cu layer 45. Consequently, with the conventional process in which the above etching gas was used, the $SiO_2$ mask was removed in the form of $SiCl_x$, $SiBr_x$ or $BO_x$, so that the resistivity was of the order of 7 at most. For this reason, film thickness of the $SiO_2$ mask of the order of 200 nm was necessitated in order to take account of deterioration which may be produced by ion impacts. According to the present invention, since the reduction-resistant layer 46a was formed on the surface of the $SiO_2$ mask 46, selectivity was improved to approximately 20, such that the $SiO_2$ mask of only 50 nm thick served the purpose. Consequently, the subsequent planarization step by the interlayer insulating film could be achieved easily.

Figure 4C:
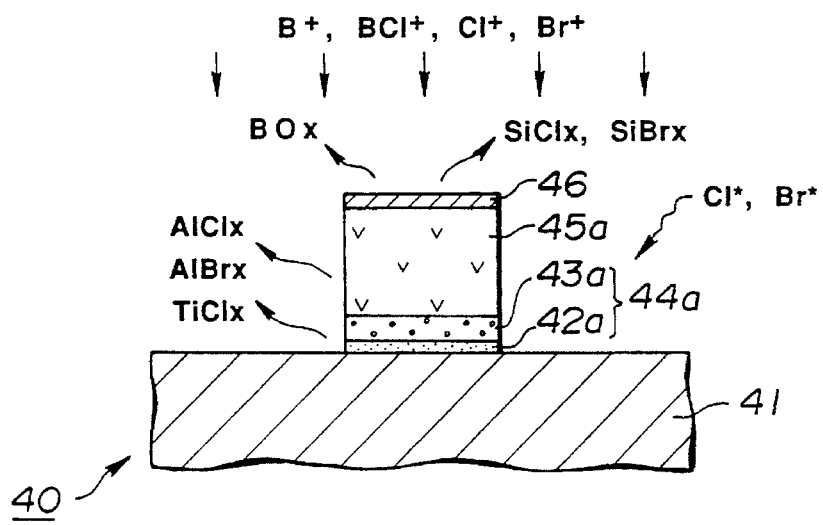

Although the state in which the reduction-resistant layer 46a has been removed completely is shown in FIG. 4c as an ultimate state, the reduction-resistant layer 46a may be left under optimized conditions obtained by suitably adjusting the $BCl_3$ flow rate or the RF bias.

Also, according to the present invention, the resistance against after-corrosion may be improved significantly because the sidewall protection film or the resist mask ready to occlude residual halogens are not present on the wafer 40. After the end of etching, the wafer 40 was allowed to stand in open air in order to check for resistance against after-corrosion. It was found that the after-corrosion occurred in 7 days, as compared to 2 days for the conventional process employing the resist mask, indicating that the resistance against after-corrosion was improved significantly.

EXAMPLE 4

In the present Example, a step of forming a reduction-resistant layer on the surface of an $SiO_2$ mask using a neutral Ar beam and a subsequent step of partially etching an Al—1% Si—0.5% Cu layer along the thickness thereof using a $BCl_3/Cl_2$/HBr mixed gas were repeated twice in this order. This process is explained by referring to FIGS. 5a to 5d. Meanwhile, the same numerals are used in FIGS. 5a to 5d to depict the parts shown in FIG. 4a to 4c.

Figure 5A:
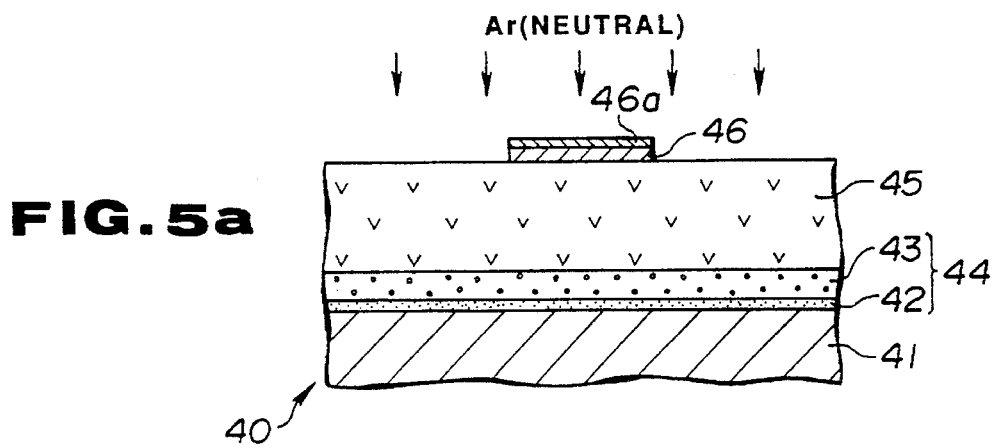
FIGS. 5a to 5d are schematic cross-sectional view showing a still further typical process according to the present invention, step by step, where

First, the wafer 40, which is in the state shown in FIG. 4a, was set in the neutral beam irradiation unit 100 of the apparatus shown in FIG. 3, and the neutral beam was irradiated in the same manner as in Example 3. The thickness of the $SiO_2$ mask 46 was set to 20 nm which was thinner than the thickness thereof shown in Example 3. By the neutral Ar beam irradiation, the reduction-resistant layer 46a was formed on the surface of the $SiO_2$ mask 46, as shown in FIG. 5a.

Figure 5B:
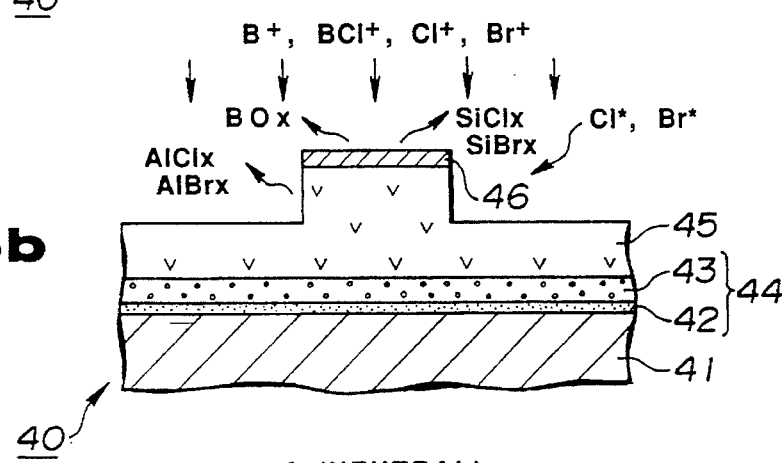

The wafer 40 was transferred into the magnetic microwave plasma etching unit 101 where the Al—1%Si—0.5% Cu layer 45 thereof was etched to half its film thickness, that is by approximately 200 nm, under the same conditions as those in Example 3. The state of the wafer 40 at this time is shown in FIG. 5b. Although the reduction-resistant layer 46a is shown to have been removed completely for convenience, the quantity of removal is smaller than that in Example 3, so that the reduction-resistant layer 46a may not be removed completely.

Figure 5C:
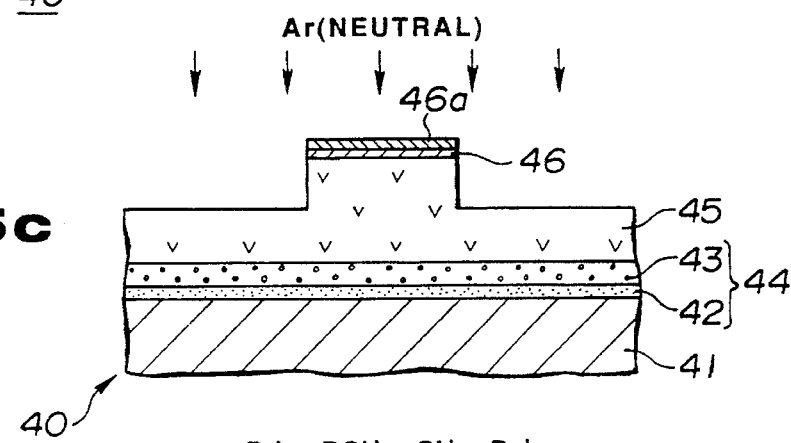
Figure 5D:
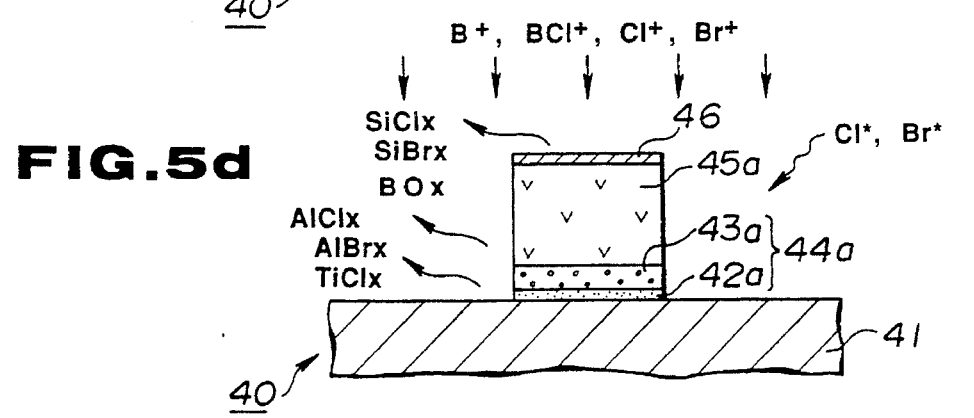

The wafer 40 was restored into the neutral beam irradiation unit 100 for irradiation with the neutral Ar beam irradiation for thereby regenerating the reduction-resistant layer 46a on the surface of the $SiO_2$ mask 46, as shown in FIG. 5c.

The wafer 40 was again transferred into the magnetic plasma etching unit 101 where the remaining portion of the Al—1% Si—0.5% Cu layer 45 and the barrier metal layer 44 were etched for producing the Al-Cu-Si metallization layer 45a and the barrier metal pattern 44a presenting shape anisotropy.

In the present Example, the etching process of the Al—1% Si—0.5%Cu layer 45 was divided into two process steps and the step of the neutral Ar beam irradiation was interposed between these steps for augmenting reduction resistance of the $SiO_2$ mask As a result thereof, the $SiO_2$ mask 46 served the purpose as an etching mask, despite the fact that the film thickness of the $SiO_2$ mask 46 was thinner than that in Example 3, thus favoring the subsequent planarizing step by the interlayer insulating film. The resistance against after-corrosion was similarly excellent.

Meanwhile, although the number of repetition of the irradiation step and the etching step was two in the above Example, mask selectivity may be improved further by increasing the number of times of repetition of the irradiation and etching steps.

EXAMPLE 5

In the present Example, the Al—1%Si—0.5% Cu layer and the barrier metal layer were etched by neutral beam assisted etching.

Figure 6:
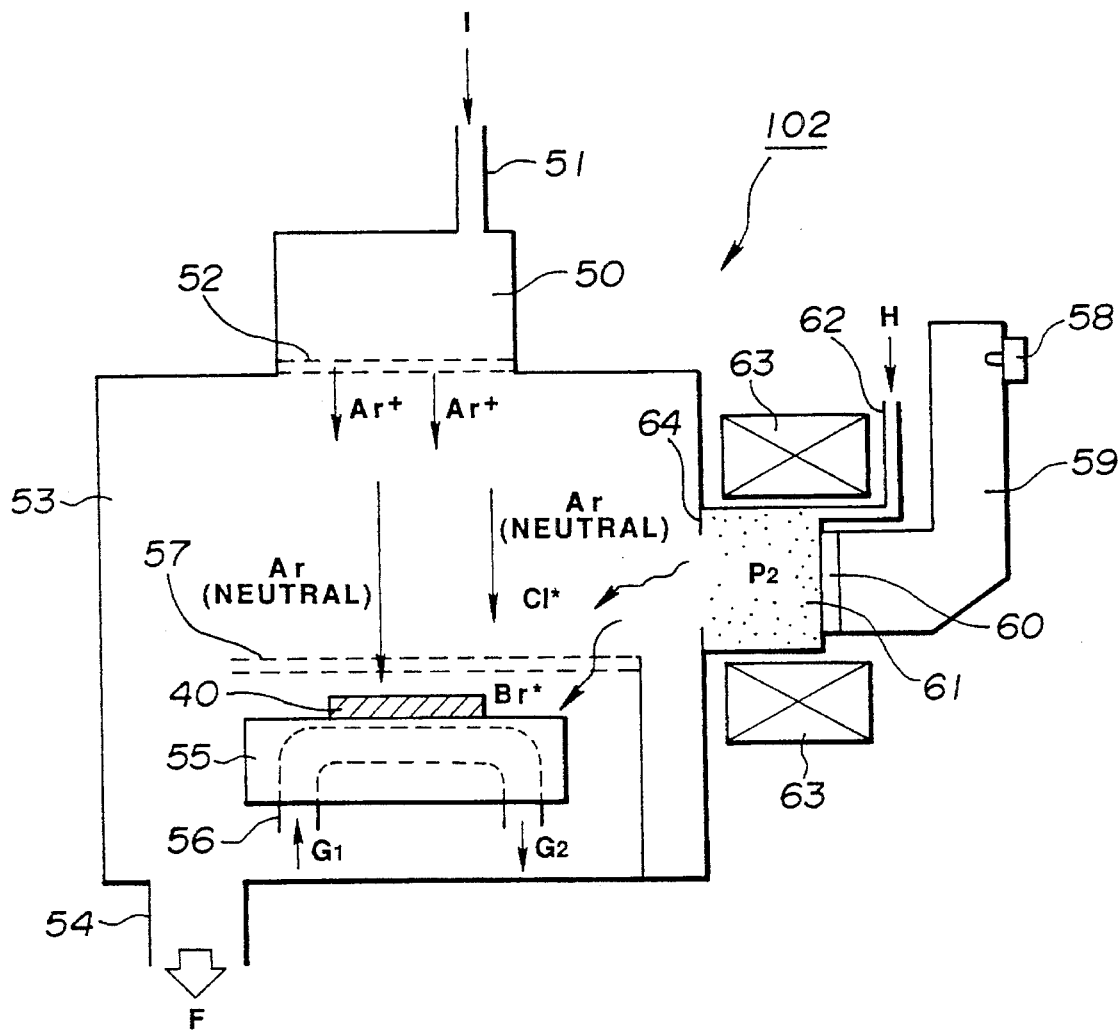
FIG. 6 is a schematic cross-sectional view showing a constructional example of a neutral beam assisted etching apparatus employed for practicing the present invention.

The construction of a neutral beam assisted etching apparatus employed in the present Example is shown schematically in FIG.6.

The neutral beam assisted etching apparatus 102 includes an ionizing chamber 50 for ionizing a feed gas supplied by means of a gas supply duct 51 in a direction shown by arrow I, an etching chamber 53 connected to the ionizing chamber 50 by means of a multiaperture electrode 52 and housing a wafer stage 55 on which to set the wafer 40, and a charged particle removal electrode mounted above the wafer 40 within the etching chamber 53 for removing residual charged particles. The inside of the etching chamber 53 is connected to a vacuum source, not shown, by means of a vent duct 54, whereby it is evacuated to high vacuum in the direction shown by arrow F in FIG. 6.

A cooling conduit 6 is embedded in the wafer stage 55 and a cooling medium is circulated from a cooing device, such as a chiller, connected to outside, in the direction shown by arrows $G_1$, $G_2$ in FIG. 6 for maintaining the wafer 40 in the cooled state. By cooling the wafer 40 in this manner, neutral active species (radicals) supplied from an ECR plasma supplying unit may be adsorbed on the wafer 40.

The ECR plasma supplying unit is arranged on a sidewall section of the etching chamber 53. In the ECR plasma supplying section, an etching gas is introduced into an ECR plasma generating chamber 61 via an etching gas supply duct 62 in the direction shown by arrow H in FIG. 6. The microwave generated by magnetron 58 is introduced into the ECR plasma generating chamber 61 via a wave guide 59 and a microwave inlet window 60. A plasma $P_2$ is generated by ECR discharge by the interaction between the microwave and the magnetic field generated by a solenoid coil 63. This plasma $P_2$ is introduced into the etching chamber 53 via plasma inlet window 64. The plasma naturally includes ions accelerated along the divergent magnetic field. However, with the present apparatus, the wafer 40 is arranged in the direction normal to the incident direction of the neutral beam without being oriented along the direction of the plasma $P_2$. Besides, the charged particle removal electrode 57 is provided above the wafer 40, so that a minor amount of ions may thereby be trapped. Thus only radicals having no motional directivity are allowed to travel through the electrode 57 so as to be adsorbed on the wafer surface. These adsorbed radicals are assisted by the kinetic energy of the neutral beam to progress the etching reaction.

Figure 7A:
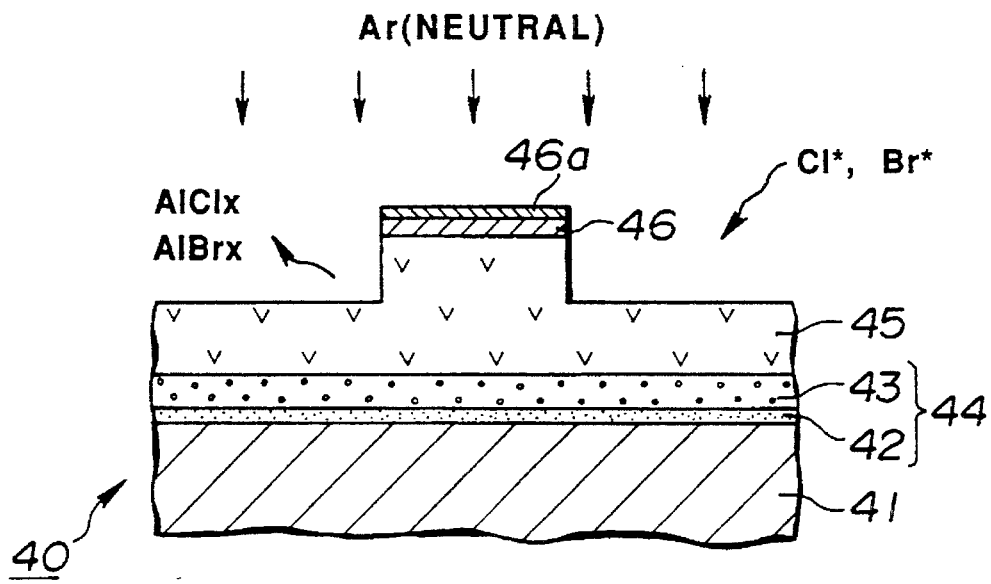
Figure 7B:
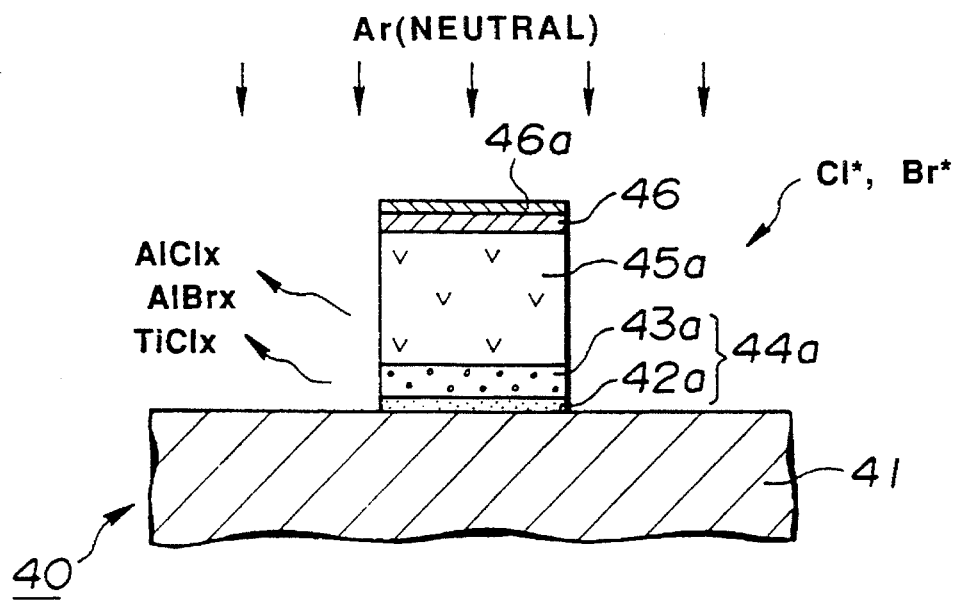

A further typical process employing the above apparatus is explained by referring to FIG. 4a and to FIGS. 7a and 7b. It is noted that, in FIGS. 7a and 7b, parts which are the same as those in FIGS. 4a to 4c are depicted by the same numerals.

First, the wafer 40 which is in the state shown in FIG. 4a was set on a wafer stage 55 of the above mentioned neutral beam assisted etching device 102, and the wafer 40 was cooled to about −30° C by circulating ethanol through cooling conduit 56. An etching gas was supplied from etching gas supply duct 62 under the conditions of a $BCl_3$ flow rate of 30 SCCM, a $Cl_2$ flow rate of 20 SCCM and an HBr flow rate of 40 SCCM and microwave discharge was carried out under the conditions of a gas pressure of 1 Pa (7.5 mTorr) and a microwave power of 1 kW (13.56 MHz). From this plasma $P_2$, radicals such as $Cl^*$ or $Br^*$ were introduced into the etching chamber 53 so as to be adsorbed on the cooled wafer surface by means of the charged particle removal electrode 57. Simultaneously, a neutral Ar beam was irradiated on the wafer 40.

In the course of this etching process, the reduction-resistant layer 46a is present at all times on the $SiO_2$ mask 46 because the wafer 40 is irradiated at all times with the neutral Ar beam. In this manner, selectivity becomes substantially infinite. On the other hand, the kinetic energy of the neutral Ar beam is transferred to $Cl^m$ or $Br^m$ adsorbed on the surface of the Al—1%-Si-0.5%Cu layer 45 so that reaction products such as $SiCl_x$ or $SiBr_x$ are produced. Etching proceeded under a mechanism in which the elimination of the reaction products was promoted by the contribution of the above mentioned kinetic energy. The etching mechanism for the barrier metal layer is similar to that described above.

In the present Example, the Al—Si—Cu metallization layer 45a having satisfactory shape anisotropy could be produced with highly satisfactory resistance against after-corrosion.

It is to be noted that the present invention is not limited to the seven typical Examples and may be suitably modified with respect to the etching gas composition, etching conditions, wafer construction or construction of the units or the apparatus.

What is claimed is:

1. A dry etching method for etching a multilayer film (comprising a layer of an aluminum-based material stacked on a second layer of a second material different than the aluminum-based material with the aid of a pattern constituted by a layer of an organic resist material as a mask, comprising the steps of plasma etching at least the layer of the aluminum-based material using an etching gas containing at least one compound selected from a group consisting of chlorine compounds and bromine compounds, and then plasma etching said second layer using an etching gas containing a compound having sulfur and fluorine as constituent elements and providing sulfur deposits during etching.

2. A dry etching method according to claim 1 wherein the compound having sulfur and fluorine as constituent elements is selected from a group consisting of $S_2F_2$, $SF_2$, $SF_4$ and $S_2F_{10}$.

3. A dry etching method according to claim 2, wherein said second material is TiW.

4. A dry etching method according to claim 1, wherein said second material is TiW.

5. A dry etching method according to claim 1, which includes, after plasma etching with the etching gas having sulfur and fluorine as a constituent, removing any deposits of sulfur.

* * * * *